United States Patent
Zhai et al.

(10) Patent No.: US 9,667,035 B1
(45) Date of Patent: May 30, 2017

(54) METHOD FOR PREPARING ORGANIC POLYMER THIN FILM LASER

(71) Applicant: Beijing University of Technology, Beijing (CN)

(72) Inventors: Tianrui Zhai, Beijing (CN); Songtao Li, Beijing (CN); Li Chen, Beijing (CN); Li Wang, Beijing (CN); Xinping Zhang, Beijing (CN)

(73) Assignee: Beijing University of Technology, Beijing (CN)

( * ) Notice: Subject to any disclaimer, the term of this patent is extended or adjusted under 35 U.S.C. 154(b) by 0 days.

(21) Appl. No.: 15/109,650

(22) PCT Filed: Jun. 30, 2015

(86) PCT No.: PCT/CN2015/082963
§ 371 (c)(1),
(2) Date: Jul. 4, 2016

(87) PCT Pub. No.: WO2016/197423
PCT Pub. Date: Dec. 15, 2016

(30) Foreign Application Priority Data

Jun. 10, 2015 (CN) .......................... 2015 1 0316248

(51) Int. Cl.
*H01L 21/00* (2006.01)
*H01S 5/12* (2006.01)
(Continued)

(52) U.S. Cl.
CPC .............. *H01S 5/12* (2013.01); *H01S 5/0211* (2013.01); *H01S 5/36* (2013.01)

(58) Field of Classification Search
USPC .......................................................... 438/32
See application file for complete search history.

(56) References Cited

U.S. PATENT DOCUMENTS

2006/0073607 A1* 4/2006 Rose .................. G01N 21/7703
436/166

FOREIGN PATENT DOCUMENTS

| CN | 102649196 A | 8/2012 |
| CN | 102651534 A | 8/2012 |

(Continued)

OTHER PUBLICATIONS

Benard Wenger et. al mechanically tunable conjugated polymer distributed feedback lasers Applied Physics Letters Aug. 11, 2010 vol. 97 193303.

*Primary Examiner* — Timor Karimy
(74) *Attorney, Agent, or Firm* — Tian IP & Technology, LLC.

(57) ABSTRACT

The present disclosure provides a preparation method of a polymer film laser. Polymer materials are dissolved in an organic solvent, a polymer solution is spin-coated on a substrate with or without a grating structure, and a homogeneous polymer thin film is formed. For the substrate without the grating structure, an interference pattern of an ultraviolet laser is used to interact with a thin polymer film, and one-dimensional or multi periods grating structures with multi directions are formed. The substrate with the thin polymer film is immersed in a hydrochloric acid solution or water and the polymer film with the grating structure peels off the substrate to obtain the polymer film laser. A pump beam is used to excite the polymer film to generate fluorescence, which is reflected and gained by the grating to obtain laser outputs.

5 Claims, 5 Drawing Sheets

2.1 Glass substrate, 2.2 ITO film, 2.3 PR gratings.

2.3 PR gratings, 2.4 Polymer.

(51) Int. Cl.
*H01S 5/36* (2006.01)
*H01S 5/02* (2006.01)

(56) References Cited

FOREIGN PATENT DOCUMENTS

| CN | 102651537 A | | 8/2012 |
|---|---|---|---|
| JP | 2009053271 | * | 3/2009 |
| JP | 2010015874 A | | 1/2010 |

* cited by examiner 1.1 Incident light, 1.2 Beam splitter, 1.3 Reflection mirror, 1.4 Sample.

2.1 Glass substrate, 2.2 ITO film, 2.3 PR gratings.

2.3 PR gratings, 2.4 Polymer.

3.1 PET plate, 3.2 Membrane polymner laser, 3.3 Circular hole.

METHOD FOR PREPARING ORGANIC POLYMER THIN FILM LASER

CROSS REFERENCE TO RELATED APPLICATION

This application is a national stage application of International application number PCT/CN2015/082963, filed Jun. 30, 2015, titled "Fabrication of free-standing membrane polymer laser," which claims the priority benefit of Chinese Patent Application No. 201510316248.3, filed on Jun. 10, 2015, which is hereby incorporated by reference in its entirety.

TECHNICAL FIELD

The present disclosure relates to the field of photoelectric technology, and more particularly to a preparation method of a polymer film laser.

BACKGROUND

In 1972, H. Kogelnik and C. Shank in Bell laboratory provided the principle and explored properties of distributed feedback laser (DFB) based on the coupled wave theory of electromagnetic field. In contrast to a Fabry-Perot laser with feedback mirrors, the DFB laser includes a periodic structure acting as a feedback cavity. The DFB laser has merits of high reflectivity, long gain length, strong wavelength selectivity, high reliability and low thresholds.

In the past decades, great developments have been achieved in the field of polymer lasers. In 1992, D. Moses et al. reported laser emission from xylene solutions of MEH-PPV with a high fluorescence-quantum yield efficiency comparable with Rhodamine 6G. In 1996, R. Friend et al. in Cavendish Lab of UK realized the emission of polymer microcavities under optical pumping conditions. In 1998, A. Heeger found that the thin film of BuEH-PPV can work as a polymer lighting emitting device with high quantum efficiency, high gain coefficient and low lasing threshold. Varieties of polymer lasers have been fabricated using simple techniques, such as flexible conjugated polymer lasers, hybrid polymer lasers, all-solid-state polymer lasers, circular grating polymer lasers, and photonic bandgap polymer lasers. However, practical applications demand miniaturization and lightweight designs of polymer lasers.

SUMMARY

In order to realize lighter, thinner, more flexible polymer lasers, a lift-off technique is developed to achieve flexible devices. The polymer lasers without a substrate can be conveniently obtained on a large scale and at low cost, and can be easily transplanted. The preparation of polymer laser includes a thin polymer film with a grating structure.

This disclosure is based on preparation of the polymer film laser, and the preparation process is on the following steps:

(S1) The polymer material is dissolved in an organic solvent with a concentration of 10-60 mg/ml.

(S2) The polymer solution is spin-coated on a substrate with or without a grating structure, and a homogeneous polymer thin film with a thickness of 50-500 nm is formed. The spinning speed is 500-4000 rpm (revolutions per minute), and the spinning time is within 30-60 s.

(S3) For the substrate without grating structure, an interference pattern of ultraviolet laser is used to interact with the thin polymer film, and one-dimensional or two-dimensional grating structures may be formed. For the substrate with the grating structure, the step above should be omitted.

(S4) The substrate with a thin polymer film is immersed in hydrochloric acid solution or water. Then the polymer film with grating structure peels off the substrate, which is named as the polymer film laser.

The candidates of the polymers can be poly[(9,9-dioctyl-fluorenyl-2,7-diyl)-alt-co-(1,4-benzo-{2,1',3}-thiadiazole)] (F8BT) or poly[(9,9'-dioctylfluorene-co-bis-N,N'-(4-butyl-phenyl)-bis-N,N'-phenyl-1,4-phenylenediamine] (PFB). The organic solvents mentioned above can be one of xylene, toluene, chlorobenzene, dichlorobenzene, benzene, chloroform, hexane, pentane, or octane. The substrate can be indium-tin-oxides (ITO) glass, fluorine doped tin oxide (FTO) glass, aluminum doped zinc oxide (AZO) glass, water soluble film of polyvinyl alcohol (PVA). The ultraviolet laser used in interference lithography is a pulsed laser with a wavelength of less than 400 nm.

The polymer is employed as gain medium and the PR grating provides feedback. Under optical pumping, the polymer film laser absorbs the pump energy and emits photoluminescence, which is refracted by the grating, to obtain laser outputs. Then, the DFB lasing is obtained.

Comparison with the traditional polymer lasers, this disclosure has obvious merits as following:

Firstly, the polymer film laser is lighter, thinner and more flexible, appropriating for exploration and application of micro devices.

Secondly, emission of the polymer film laser shows a good monochromaticity with a narrower full width at half maximum (FWHM).

Lastly, the output characteristics of polymer film laser can be adjusted by changing a grating parameter or the gain materials.

Figure 1:
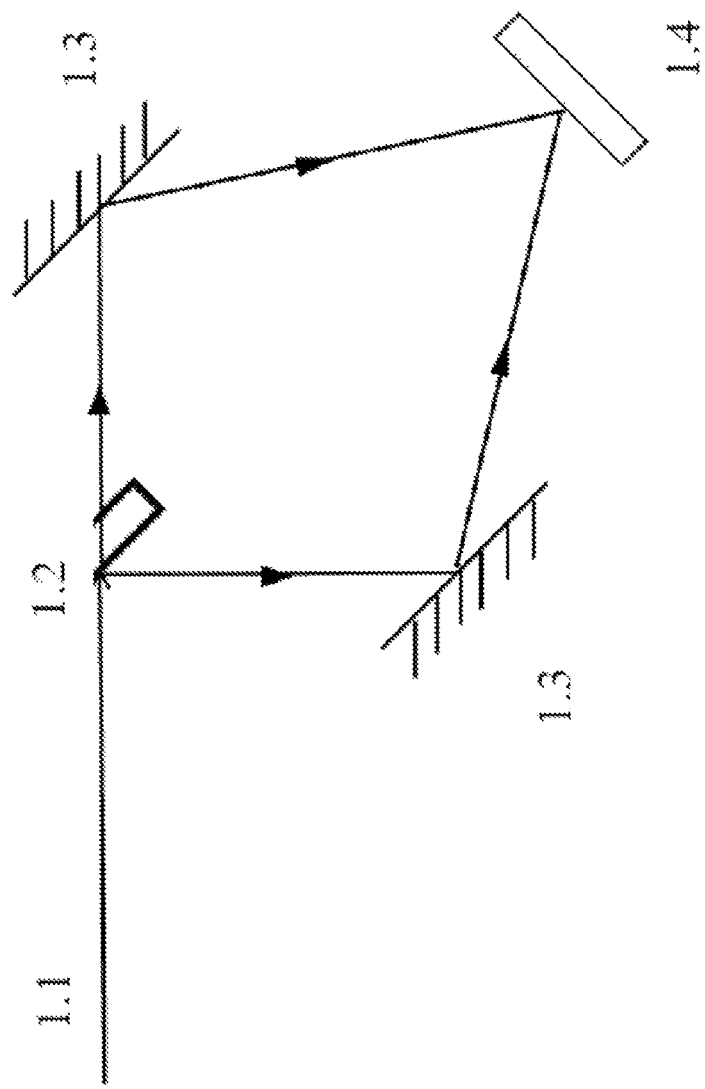
FIG. 1 is an optical path for preparation of PR gratings in accordance with implementations of the present disclosure.
Figure 2:
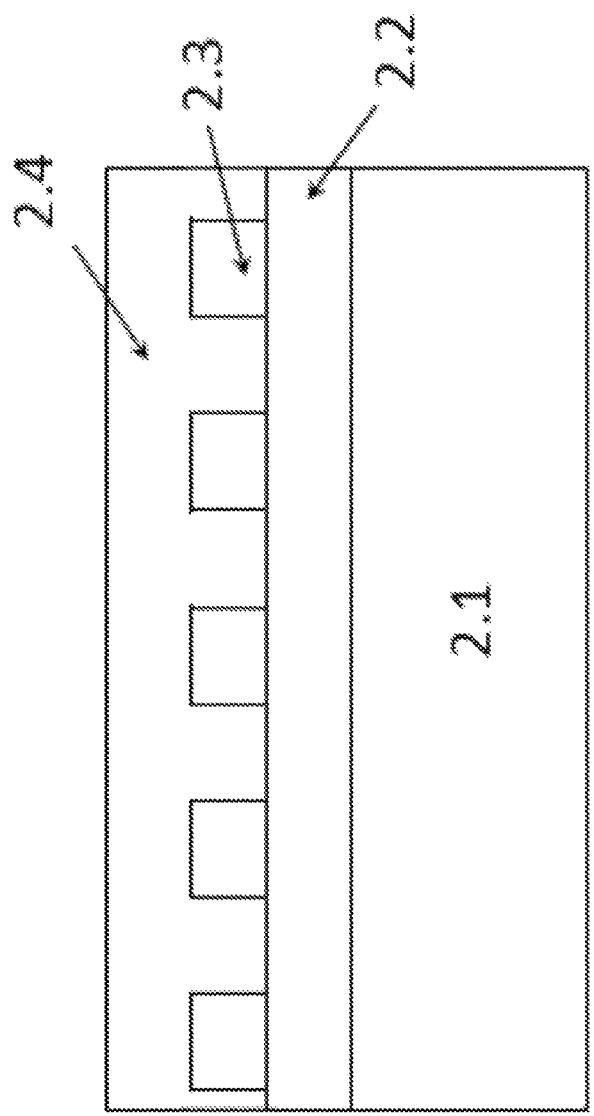
FIG. 2 is a schematic diagram of a polymer film laser on ITO glass in accordance with implementations of the present disclosure.
Figure 3:
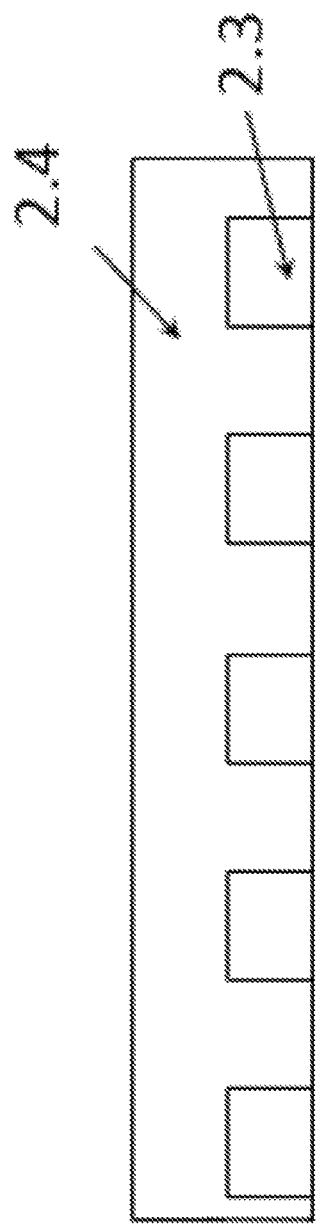
FIG. 3 is a schematic diagram of a polymer film laser in accordance with implementations of the present disclosure.
Figure 4:
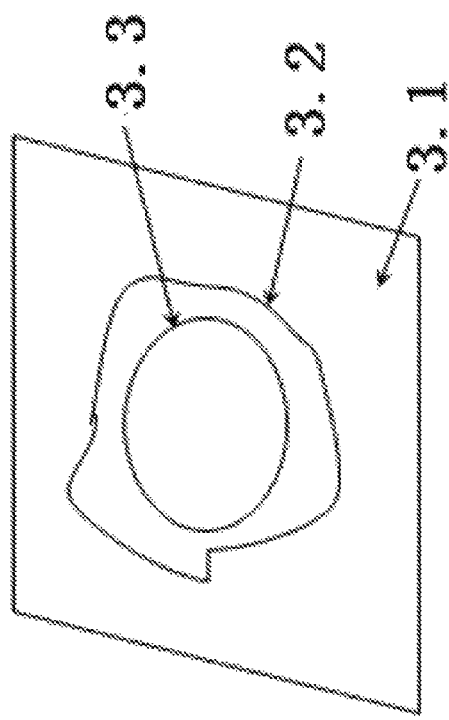
FIG. 4 is a schematic diagram of a polymer film laser on a PET plate in accordance with implementations of the present disclosure.
Figure 5:
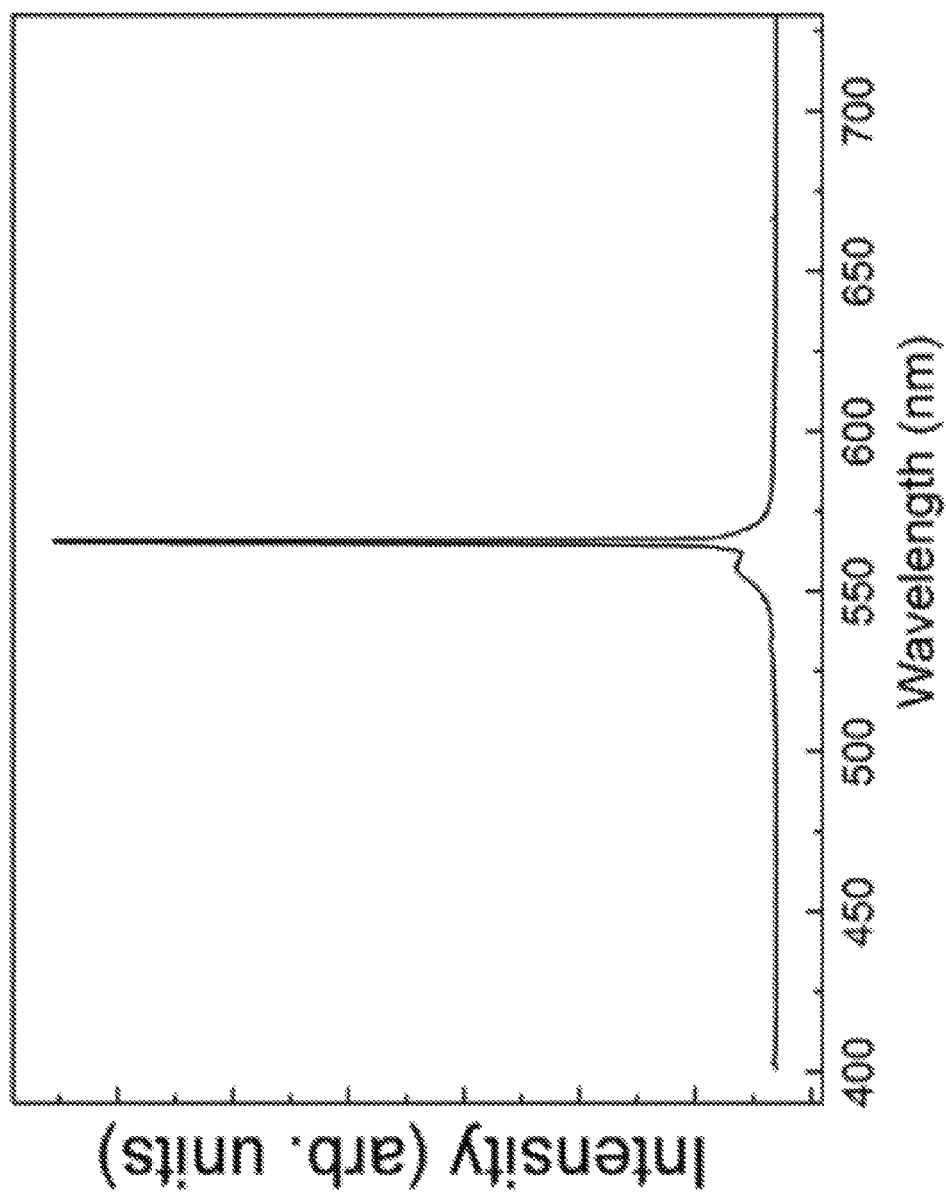
FIG. 5 shows measured spectra of a polymer film laser in accordance with implementations of the present disclosure.

As illustrated in the figures above, 1.1 represents Incident light, 1.2 represents Beam splitter, 1.3 represents Reflection mirror, 1.4 represents Sample, 2.1 represents Glass substrate, 2.2 represents ITO film, 2.3 represents PR gratings, 2.4 represents Polymer, 3.1 represents PET plate, 3.2 represents Polymer film laser, and 3.3 represents Circular hole.

DETAILED DESCRIPTION OF THE PREFERRED EMBODIMENTS

A polymer film laser is a thin polymer film device with a grating structure. The polymer works as gain medium and the grating provides feedback. Under optical pumping, polymer molecules in the polymer film laser absorb the pumping energy, and emit photoluminescence. The photoluminescence is refracted by the gratings. Then the DFB laser is achieved.

Combined with the companying figures, the example is the technical scheme, but not limited to the example. In preparation of the polymer film laser, ITO glass is a substrate, and the polymer is F8BT. The preparation is based on the following steps:

(S1) The photoresist (PR, Allresist AR-P-3170) solution is spin-coated on an ITO-coated glass substrate (15 mm×15 mm×1 mm), with a speed of 3000 rpm for 30 seconds.

(S2) The ITO substrate is heated on a hot plate at 100° C. for 1 minute to obtain a PR film with 120 nm thickness. Then the PR gratings is produced by interference lithography. The pulse laser (1.1) is split into two beams by a beam splitter (1.2). The two beams are reflected by the total reflection mirror (1.3) to focus on the sample (1.4). A He—Cd Laser is employed as the pulse laser, with 325 nm wavelength and 10 mW total power. After exposing 10 s and developing 6 s, the grating (2.3) of a period of 355 nm is obtained.

(S3) The F8BT solution in xylene with a concentration of 25 mg/ml is spin-coated on the PR grating (2.3) with a speed of 1000 rpm for 30 s. A thin film of F8BT with a thickness of about 170 nm is obtained on the PR grating.

(S4) The ITO glass covered with PR gratings and thin polymer film is immersed in a hydrochloric acid with a mass concentration of 20% for 20 min. The ITO layer (2.2) on the glass substrate is dissolved in the hydrochloric acid, and a thin film including of PR grating (2.3) and F8BT film peels off the glass substrate (2.1). Finally, the film, named as the polymer film fiber (3.2), floats on the surface of the hydrochloric acid solution.

(S5) A Polyethylene terephthalate (PET) plate (3.1) with a circular hole (3.3) of 20 mm diameter and thickness of 0.4 mm is employed as a frame for the free-standing film device (3.2). The film is picked up by the PET frame (3.1), and covers the circular hole (3.3).

(S6) The polymer film laser is excited by a femtosecond pump beam with a wavelength of 400 nm, and a repetition frequency of 1 kHz and a pulse length of 200 fs. The emission wavelength is 566 nm for the polymer film laser (3.2).

The disclosure describes the preparation method for a polymer film laser.

What is claimed is:

1. A method for preparing an organic laser comprising a grating structure and a polymer film, the method comprising:
    (S1) dissolving polymer materials of the polymer film using an organic solvent to obtain an organic polymer solution having a mass concentration of 10-60 mg/ml;
    (S2) spin-coating the organic polymer solution on a substrate with or without the grating structure for 30-60 seconds with a speed of 500-4000 rpm to obtain the polymer film with a thickness of 50-500 nm;
    (S3) in response to a determination that the substrate does not have the grating structure, interacting using an interference lithography of an ultraviolet laser with the polymer film to form a one-dimensional or two-dimensional grating structure;
    in response to a determination that the substrate has the grating structure, ignoring the step (S3); and
    (S4) placing the substrate of the polymer film into a solution containing hydrochloric acid solution or water to remove the substrate to obtain the organic laser, wherein the substrate is ITO glass, and the organic laser is organic polymer thin film laser with a single-wavelength output, the method further comprising:
    (S5) spin-coating a photoresist (PR) solution on an ITO-coated glass substrate (15 mm×15 mm×1 mm) with a speed of 3000 rpm for 30 seconds;
    (S6) heating the ITO substrate on a hot plate at 100° C. for 1 minute to obtain a PR film with a thickness of 120 nm, preparing a PR grating using an interference lithography, wherein a pulse laser is split into two beams by a beam splitter, the two beams are reflected by dielectric film total reflection mirrors to focus on a sample, a He—Cd laser is employed as a pulse source with a wavelength of 325 nm and a total power of 10 mW to obtain the PR grating with a period of 355 nm after exposing 10 s and a exposure and development time of about 6 seconds;
    (S7) spin-coating a xylene solution with a concentration of 25 mg/ml on the PR grating with a speed of 1000 rpm for 30 s to obtain a film with a thickness of about 170 nm on the PR grating;
    (S8) placing the ITO glass covered with the PR grating and the film in a solution contain hydrochloric acid with a mass concentration of 20% for 20 min to dissolve the ITO glass to obtain, on a surface of the solution, a polymer film suitable for the organic laser that comprises the PR grating and the film;
    (S9) providing a Polyethylene terephthalate (PET) plate with a circular hole of 20 mm diameter and thickness of 0.4 mm as a frame for a free-standing film device, placing the polymer film suitable for the organic laser on the frame to cover the circular hole to obtain the organic laser; and
    (S10) exciting the organic laser using a femtosecond pump beam with a wavelength of 400 nm, a repetition frequency of 1 kHz and a pulse length of 200 fs to obtain an emission with a wavelength of 566 nm from an area of the polymer film of the organic laser.

2. The method of claim 1, wherein the polymer materials are at least one of poly[(9,9-dioctylfluorenyl-2,7-diyl)-alt-co-(1,4-benzo-{2,1',3}-thiadiazole)] or poly[(9,9'-dioctyl-fluorene-co-bis-N,N'-(4-butylphenyl)-bis-N,N'-phenyl-1,4-phenylenediamine] (PFB).

3. The method of claim 1, wherein the organic solvent is at least one of xylene, toluene, chlorobenzene, dichlorobenzene, benzene, chloroform, hexane, pentane, or octane.

4. The method of claim 1, wherein the substrate is at least one of indium-tin-oxides (ITO) glass, fluorine doped tin oxide (FTO) glass, aluminum doped zinc oxide (AZO) glass, or water soluble films of polyvinyl alcohol (PVA).

5. The method of claim 1, wherein the ultraviolet laser is a pulsed laser with a wavelength of less than 400 nm.

* * * * *